(12) United States Patent
Tsuji et al.

(10) Patent No.: US 7,037,855 B2
(45) Date of Patent: May 2, 2006

(54) METHOD OF FORMING FLUORINE-DOPED LOW-DIELECTRIC-CONSTANT INSULATING FILM

(75) Inventors: Naoto Tsuji, Tama (JP); Yozo Ikedo, Tama (JP); Ryu Nakano, Tama (JP); Shuzo Hebiguchi, Tama (JP)

(73) Assignee: ASM Japan K.K., Tokyo (JP)

( * ) Notice: Subject to any disclaimer, the term of this patent is extended or adjusted under 35 U.S.C. 154(b) by 59 days.

(21) Appl. No.: 10/930,380

(22) Filed: Aug. 31, 2004

(65) Prior Publication Data

US 2006/0046519 A1    Mar. 2, 2006

(51) Int. Cl.
*H01L 21/31* (2006.01)
(52) U.S. Cl. ............... 438/758; 438/778; 438/779; 438/479
(58) Field of Classification Search ............. None
See application file for complete search history.

(56) References Cited

U.S. PATENT DOCUMENTS 6,303,518 B1 * 10/2001 Tian et al. ............ 438/758
6,511,922 B1 * 1/2003 Krishnaraj et al. ......... 438/778

2004/0091717 A1    5/2004 Li et al.

FOREIGN PATENT DOCUMENTS

JP        2002-141348         5/2002

OTHER PUBLICATIONS

Hyeok-Sang Oh, et al., The Effect of FSG Stability at High Temperature on Stress-Induced Voiding in Cu Dual-damascene Interconnects, Jun., 2004.

* cited by examiner

*Primary Examiner*—David Nelms
*Assistant Examiner*—Long Tran
(74) *Attorney, Agent, or Firm*—Knobbe Martens Olson & Bear, LLP (57) ABSTRACT

A method of forming low-dielectric-constant silicon oxide films by capacitive-coupled plasma CVD comprises: introducing a processing gas comprising $SiH_4$ as a silicon source gas, $SiF_4$ as a fluorine source gas, and $CO_2$ as an oxidizing gas to a reaction chamber at a ratio of $(SiH_4+SiF_4)/CO_2$ in the range of 0.02 to 0.2 and at a total pressure of 250 Pa to 350 Pa; applying first RF power at a frequency of 10 MHz to 30 MHz and second RF power at a frequency of 400 kHz to 500 kHz by overlaying the two RF powers to generate a plasma reaction field within the reaction chamber; and controlling a flow of the respective gases and the respective RF power outputs.

24 Claims, 12 Drawing Sheets

METHOD OF FORMING FLUORINE-DOPED LOW-DIELECTRIC-CONSTANT INSULATING FILM

BACKGROUND OF THE INVENTION

1. Field of the Invention

The present invention generally relates to semiconductor formation technologies using capacitive-coupled plasma CVD, and particularly relates to a method of forming fluorine-doped low-dielectric-constant silicon oxide films having a low dielectric constant and high thermal stability.

2. Description of the Related Art

In semiconductor integrated circuits, miniaturization has made progress aiming at increasing speeds and providing more sophisticated features. In multilevel interconnect technologies, aluminum had been conventionally used. As the miniaturization had advanced and interconnects had become minute and long, however, problems have emerged including electromigration during use, i.e., disconnection accidents caused by increased current density relative to minute and long interconnects, or signal delays caused by the resistivity of aluminum or a dielectric constant of an insulating film.

Because copper is resistant to disconnection accidents and has further small resistivity, copper interconnect technology has been developed for future interconnects. Because application of conventional manufacturing processes to copper interconnects, however, is difficult, putting the copper interconnect technology to practical use has not been progressed easily. In 1997, Cu trench filling interconnect technology called "Dual-Damascene", in which a trench is formed in an interlevel layer by etching and is backfilled by electroplating a Cu thin film and the entire surface is polished by CMP (Chemical Mechanical Polishing), was developed respectively by IBM and Motorola. In conventional methods, an Al film was etched to form a convex interconnect pattern; an interlayer was filled with an insulating film. As against this, the Damascene interconnect technology deposits a Cu thin film on the entire surface including a trench formed in a planar interlayer insulating film; the surface of the insulating film is subjected to CMP for polishing so that Cu remains only in a trench portion to create an interconnect.

Consequently, use of capacitive-coupled plasma CVD apparatuses for forming low-dielectric-constant insulating films has become possible in place of high-priced HDP (high density plasma) apparatuses which conventionally were essential for filling an interlayer with an insulating film; as disclosed in Japanese Patent Laid-open No. 2002-141348, an embodiment using $SiH_4$ as a silicon source gas, $SiF_4$ as a silicon and fluorine source gas, and $N_2O$ as an oxidizing gas is disclosed.

SUMMARY OF THE INVENTION

Fluorine-doped low-dielectric-constant silicon oxide films, which are formed using a capacitive-coupled plasma CVD apparatus, and $SiH_4$ as a silicon source gas, $SiF_4$ as a silicon and fluorine source gas and $N_2O$ as an oxidizing gas, however, have a shortcoming that their stress fluctuations are significant when subjected to a thermal stress stability test. Additionally, from the result of temperature-programmed desorption (TDS, thermal disorption spectroscopy), desorption of $H_2O$, F, and HF at 400° C. or higher is significant, which indicates that the films' thermal stability is poor.

The present invention was achieved in view of the above-mentioned problems. Among others, an object of the present invention in an embodiment is to provide a method of forming fluorine-doped low-dielectric-constant silicon oxide films having a low dielectric constant and high thermal stability. Another object of the present invention in an embodiment is to provide a method of forming fluorine-doped low-dielectric-constant silicon oxide films without increasing apparatus costs.

In an aspect, the present invention provides a method of forming a fluorine-doped silicon oxide film nearly or substantially free of hydrogen, using capacitive-coupled plasma CVD. The method comprises: (i) introducing a processing gas comprising $SiH_4$ as a silicon source gas, $SiF_4$ as a fluorine source gas, and $CO_2$ as an oxygen source gas to a reaction chamber at a flow ratio of $(SiH_4+SiF_4)/CO_2$ in the range of about 0.02 to about 0.2 (e.g., 0.03, 0.05, 0.1, 0.15, and ranges between any two numbers of the foregoing) and at a total pressure of about 250 Pa to about 350 Pa; and (ii) applying first RF power at a frequency of about 10 MHz to about 30 MHz (e.g., 15 MHz, 20 MHz, 25 MHz, and ranges between any two numbers of the foregoing) and second RF power at a frequency of about 400 kHz to about 500 kHz (e.g., 425 kHz, 450 kHz, 475 kHz, and ranges between any two numbers of the foregoing) with lower intensity than that of the first RF power (e.g., ratios of the first RF power/the second RF power of 55/45, 60/40, 70/30, 80/20, 90/10, 95/5, and ranges between any two numbers of the foregoing) by overlaying the two RF powers to generate a plasma reaction field within the reaction chamber, thereby depositing on a substrate a fluorine-doped silicon oxide film nearly or substantially free of hydrogen.

In the above aspect, when the fluorine-doped silicon oxide film is nearly or substantially free of hydrogen, its thermal stability can improve significantly. The film can be obtained by using the above specific RF power which facilitates dissociation of hydrogen, and by using $CO_2$ at the above specific rate.

The above aspect further includes, but is not limited to, the following embodiments:

In a preferred embodiment, the processing gas may further comprise an inert gas at a flow rate more than ten times that of $SiH_4$ (e.g., ratios of inert gas/$SiH_4$ of 11/1, 13/1, 15/1, 20/1, 30/1, and ranges between any two numbers of the foregoing). The inert gas may be He and/or Ar. The inert gas is effective to stabilize plasmas.

Further, in a preferred embodiment, a frequency of the first RF power may be about 13.56 MHz, its intensity may be in the range of about 1.0 W/cm² to about 5.0 W/cm² per substrate surface (e.g., 1.5 W/cm², 2.0 W/cm², 2.5 W/cm², 3 W/cm², 4 W/cm², and ranges between any two numbers of the foregoing) and a frequency of the second RF power may be about 430 kHz, and its intensity may be in the range of about 0.5 W/cm² to about 3.0 W/cm² per substrate surface (e.g., 0.75 W/cm², 1.0 W/cm², 1.25 W/cm², 1.5 W/cm², 2.0 W/cm², and ranges between any two numbers of the foregoing). The substrate may have a diameter of 200 mm or 300 mm.

In a preferred embodiment, $CO_2$ may be the sole oxygen source gas. The $SiH_4$ gas, the $SiF_4$ gas, and the $CO_2$ gas may be introduced into the reaction chamber as a mixture of the gases.

In another aspect, the present invention provides a method of forming a fluorine-doped silicon oxide film nearly or substantially free of hydrogen, using capacitive-coupled plasma CVD. The method comprises: (i) introducing a processing gas comprising $SiH_4$ as a silicon source gas, $SiF_4$ as a fluorine source gas, $CO_2$ as an oxygen source gas, and an inert gas to a reaction chamber; (ii) applying first RF power at a frequency of about 10 MHz to about 30 MHz and second RF power at a frequency of about 400 kHz to about 500 kHz with lower intensity than that of the first RF power by overlaying the two RF powers to generate a plasma reaction field within the reaction chamber; and (iii) depositing on a substrate a fluorine-doped silicon oxide film nearly or substantially free of hydrogen by controlling a flow of $CO_2$ at a rate which is at least 5 times that of the sum of $SiH_4$ and $SiF_4$ and a flow of the inert gas at a rate which is more than 10 times that of $SiH_4$. In this aspect, one of more of any ranges and elements usable in the aforesaid embodiments can be used.

In still another aspect, the present invention provides a method of forming a fluorine-doped silicon oxide film containing less than 1 atomic % of hydrogen and less than 2 atomic % of carbon, using capacitive-coupled plasma CVD. The method comprises: (i) introducing a processing gas comprising $SiH_4$ as a silicon source gas, $SiF_4$ as a fluorine source gas, and $CO_2$ as an oxygen source gas without including $O_2$ gas to a reaction chamber; and (ii) generating an O-containing plasma for oxidizing the $SiH_4$ and the $SiF_4$ to deposit a fluorine-doped silicon oxide film on a substrate while generating a CO-containing plasma for controlling the oxidization, using a combination of a frequency of about 10 MHz to about 30 MHz and a frequency of about 400 kHz to about 500 kHz to dissociate hydrogen nearly or substantially without doping carbon into the fluorine-doped silicon oxide film. Under the above conditions, despite the fact that $CO_2$ is used as an oxygen source gas, carbon is nearly or substantially not doped into the film. Although carbon may be detected in the film, carbon may not be incorporated into the film structure, but may be present as a contaminant. The film is nearly or substantially free of hydrogen, resulting in excellent thermal stability. In this aspect, one or more of any ranges and elements usable in the aforesaid embodiments can be used.

In the above aspect, $CO_2$ need not be the sole oxygen source gas as long as $CO_2$ is a major gas. The oxidization may be conducted at any temperature suitable for the reaction gas, but preferably at a temperature of about 150° C. to about 450° C.

In yet another aspect, the present invention provides a method of forming a fluorine-doped silicon oxide film containing nearly or substantially no hydrogen and nearly or substantially no carbon doped, using capacitive-coupled plasma CVD. The method comprises: (i) introducing a processing gas comprising $SiH_4$ as a silicon source gas, $SiF_4$ as a fluorine source gas, and $CO_2$ as a single oxygen source gas to a reaction chamber; (ii) applying first RF power at a frequency of about 10 MHz to about 30 MHz and second RF power at a frequency of about 400 kHz to about 500 kHz by overlaying the two RF powers to generate a plasma reaction field within the reaction chamber, thereby depositing on a substrate a fluorine-doped silicon oxide film containing nearly or substantially no hydrogen and nearly or substantially no carbon doped; and (iii) improving thermal stability of the depositing fluorine-doped silicon oxide film as a function of a flow of $CO_2$ with respect to that of the sum of $SiH_4$ and $SiF_4$ and as a function of concentration of hydrogen in the film. In this aspect, one or more of any ranges and elements usable in the aforesaid embodiments can be used.

The present invention can be applied to a fluorine-doped silicon oxide film obtained by any of the methods described above. The film may preferably contain 30–45 atomic % (e.g., 35 atomic %, 40 atomic %, and ranges between any two numbers of the foregoing) of silicon, 50–70 atomic % (e.g., 55 atomic %, 60 atomic %, 65 atomic %, and ranges between any two numbers of the foregoing) of oxygen, 4–8 atomic % (e.g., 5 atomic %, 6 atomic %, 7 atomic %, and ranges between any two numbers of the foregoing) of fluorine, less than 1 atomic % (e.g., 0.5 atomic %, 0.1 atomic %, and ranges between any two numbers of the foregoing) of hydrogen, less than 2 atomic % (e.g., 1.5 atomic %, 1.0 atomic %, 0.5 atomic %, and ranges between any two numbers of the foregoing) of carbon, and less than 1 atomic % (e.g., no detectable amount) of nitrogen. In a preferred embodiment, the concentration of each element is nearly or substantially constant in a thickness direction. According to one or more methods described above, the concentration of hydrogen does not increase as the film is depositing, i.e., hydrogen does not accumulate during film formation, thereby accomplishing uniformity of properties in a thickness direction.

In an embodiment, the film may have a dielectric constant of about 3.0 to about 5.0 (in another embodiment, about 3.5 to about 4.0).

In the foregoing embodiments of the present invention, any element used in an embodiment can be interchangeably used in another embodiment as long as it is feasible. No restriction should not be imposed on selecting elements between embodiments. In particular, any of the dependent features described above should be able to be used in any of the independent configurations.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

The invention will be explained further with reference to specific embodiments, but the invention should not be limited thereto.

To solve the above-mentioned problems, in an embodiment, the method of forming low-dielectric-constant silicon oxide films by capacitive-coupled plasma CVD comprises the steps of: (a) introducing a processing gas comprising $SiH_4$ as a silicon source gas, SiF4 as a fluorine source gas, and $CO_2$ as an oxidizing gas to a reaction chamber at a ratio of $(SiH_4+SiF_4)/CO_2$ in the range of about 0.02 to about 0.2 and at a total pressure of about 250 Pa to about 350 Pa; (b) applying first RF power at a frequency of about 10 MHz to about 30 MHz and second RF power at a frequency of about 400 kHz to about 500 kHz by overlaying the two RF powers to generate a plasma reaction field within the reaction chamber; and (c) controlling a flow of the respective gases and the respective RF power outputs.

In an embodiment, the processing gas can contain He and/or Ar as an inert gas.

In another embodiment, a frequency of the first RF power may preferably be about 13.56 MHz; its intensity may preferably be in the range of about 1.0 W/cm² to about 5.0 W/cm². A frequency of the second RF power may preferably be about 430 kHz; its intensity may preferably be in the range of about 0.5 W/cm² to about 3.0 W/cm².

The present invention is described in detail with reference to figures. However, the present invention is not limited to the figures.

In an embodiment of the present invention, a fluorine-doped low-dielectric-constant silicon oxide film is formed using a capacitive-coupled plasma CVD apparatus, with $SiH_4$ as a silicon source gas, $SiF_4$ as a silicon and fluorine source gas, and $CO_2$ as an oxidizing gas, and when a thermal stress stability test is conducted, the film has insignificant stress fluctuations and improved thermal stability. Additionally, when the film is analyzed by temperature-programmed desorption (TDS; thermal dsorption spectroscopy), desorption of $H_2O$, F and HF at 400° C. or higher is much less as compared with a film formed using a conventional HDP apparatus, which indicates that the film has excellent thermal stability.

Improvement effects are described below by illustrating a configuration of the apparatus and a preferred embodiment of a method of using the same.

Figure 1:
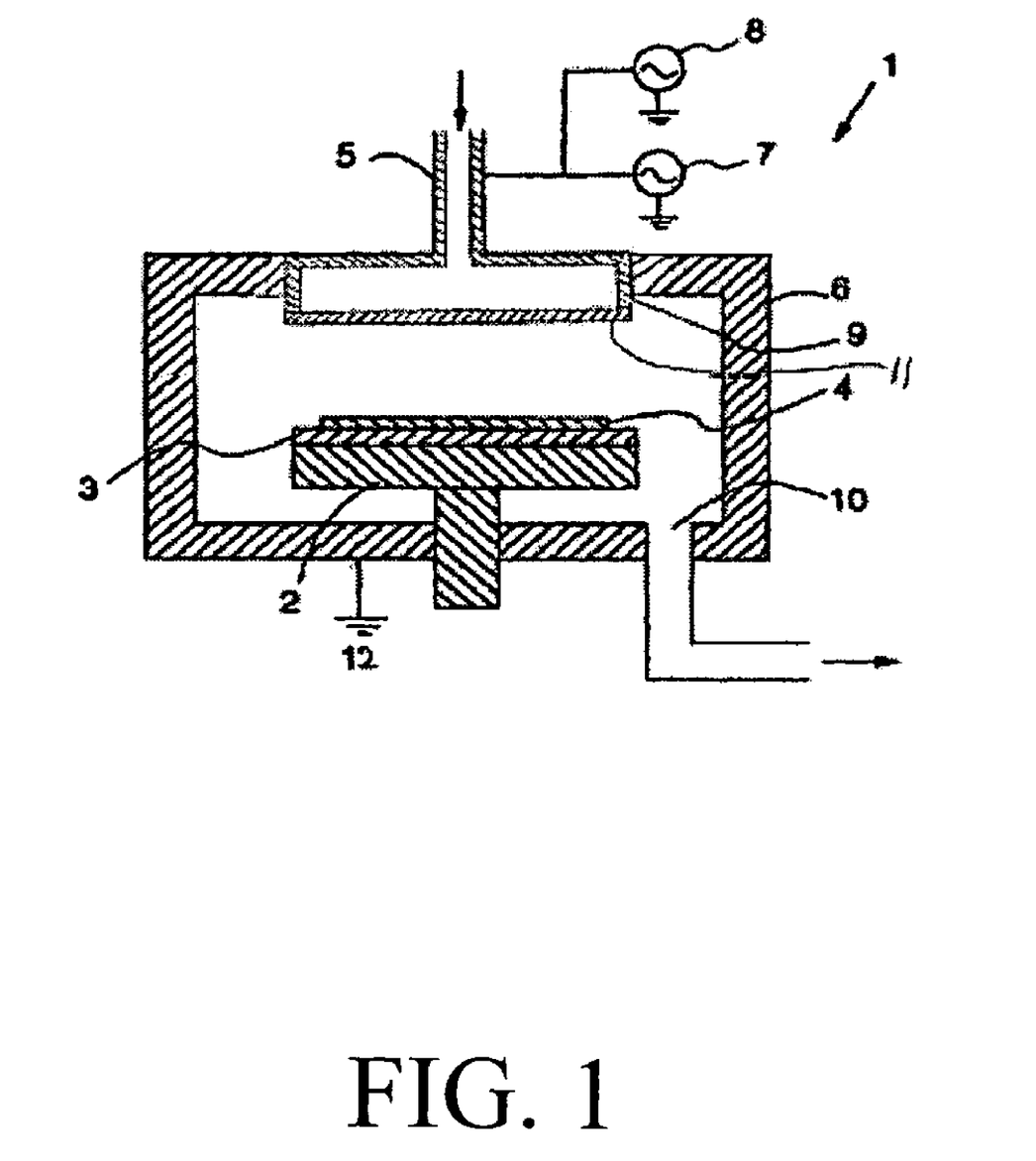
FIG. 1 is a schematic view of an apparatus usable in an embodiment of the present invention.

FIG. 1 is a schematic view of a plasma apparatus used in an embodiment of the present invention. The capacitive-coupled plasma CVD apparatus 10 includes a reaction chamber 6, a gas inlet port 5, and a second electrode comprising a susceptor 3 and a heater 2. From a gas line not shown, a gas is introduced through the gas inlet port 5. A first electrode 9 having a circular shape is set up beneath the gas inlet port 5; the first electrode 9 has a hollow structure with a number of fine pores at its bottom, from which a jet of gas is emitted to an object to be processed 4. Additionally, the first electrode 9 is constructed so that a shower plate 11 having multiple gas inlet fine pores can be replaceable in order to facilitate ease of maintenance and to reduce parts costs.

Additionally, an exhaust port 10 is provided at the bottom of the reaction chamber 6, which is coupled with an external vacuum pump (not shown); thereby the inside of the reaction chamber 6 is evacuated. The susceptor 3 is set up facing and parallel to the first electrode 9. The susceptor 3 holds the object to be processed thereon, heats the object 4 continuously by the heater 2, and maintains the substrate 4 at a given temperature (150 to 450° C.). The gas inlet port 5 and the first electrode 9 are insulated from the reaction chamber 6 and are connected to the first RF power source 7 externally provided. The second RF power source 8 is connected at this time. The number 12 indicates grounding. The first electrode and the second electrode thus function as RF electrodes and generate a plasma reaction field in the vicinity of the object to be processed 4.

Film characteristics of a film formed on a surface of the object to be processed 4 change according to a type, temperature, RF frequency type of a processing gas, plasma spatial distribution, and electric potential distribution.

In preferred embodiments, the following processing conditions may be employed:

$He/SiH_4$=13–20
$CO_2/SiH_4$=25–125
$SiF_4/SiH_4$=1.3–5
13.56 MHz power/430 kHz power=1.3–2

EXAMPLES

The capacitive-coupled plasma CVD apparatus shown in FIG. 1 was used for both an embodiment and a comparative example.

Deposition Conditions for Comparative Example
Silicon source gas: $SiH_4$ (50 sccm)
Silicon and fluorine source gas: $SiF_4$ (90 sccm)
Oxidizing gas: $N_2O$ (3000 sccm)
Inert gas: He (800 sccm)
Total pressure: (333 Pa)
Substrate temperature: (390° C.)
The first RF power source (HRF): 13.56 MHz (2.55 W/cm², 800 W)
The second RF power source (LRF): 430 kHz (1.60 W/cm², 500 W)
Substrate: Ø200 mm silicon substrate
Deposition Conditions for Examples
Silicon source gas: $SiH_4$ (40 to 60 sccm)
Silicon and fluorine source gas: $SiF_4$ (80 to 200 sccm)
Oxidizing gas: $CO_2$ (1500 to 5000 sccm) [$(SiH_4+SiF_4)/CO_2$=0.024 to 0.173]
Inert gas: He (800 sccm)
Total pressure: (250 to 350 Pa)
Substrate temperature: (390° C.)
The first RF power source (HRF): 13.56 MHz (0.96 to 3.82 W/cm², 300 to 1200 W)
The second RF power source (LRF): 430 kHz (0.64 to 2.55 W/cm², 200 to 800 W)
Substrate: Ø200 mm silicon substrate
(A parameter experiment was conducted in the above-mentioned ranges in parentheses.)
Items Evaluated
Refractive index (–), deposition rate (nm), film thickness distribution (±%), stress (MPa), thermal stress stability test (Stress fluctuation at room temperature after a cycle (MPa));

stress fluctuation at 500° C. (MPa)), dielectric constant (–), fluorine concentration in a film (peak area ratio) (%), and temperature-programmed desorption (TDS). In the above, the "cycle" means raising the temperature from room temperature to 500° C. at 3° C./min, maintaining the temperature at 500° C. for one hour, and lowering the temperature to room temperature at 3° C./min, and "at 500° C." means before and after the thermal cycle.

To evaluate fluorine concentration in a film (peak area ratio) here, a peak area ratio of Si—O bonds (975–1450 $cm^{-1}$) to Si—F bonds (900–975 $cm^{-1}$) measured by Fourier transform infrared spectroscopy was used. That is, fluorine concentration in a film (peak area ratio) (%)=Si—F bonds peak area/(Si—O bonds peak area+Si—O bonds peak area)× 100%.

Additionally, to obtain a correlation between the fluorine concentration in a film (peak area ratio) (%) obtained by FT-IR and a film composition (atom %), a composition of a film having the fluorine concentration in a film (peak area ratio)=1.46 (%) was analyzed by XPS, and a value obtained was 5.6 (atom %).

Results (1) Comparative Example
Refractive index (–): 1.45
Deposition rate (nm): 360
Film thickness distribution (±%): 1.40
Stress (MPa): –168
Thermal stress stability test (increase)
After a cycle (MPa): 25.8
At 500° C. (MPa): 118.2
Dielectric constant (–): 3.80
Fluorine concentration in a film (peak area ratio) (%): 1.56

(2) Parameter Experiment of the Embodiment
Refractive index (–): 1.43 to 1.46
Deposition rate (nm): 384 to 634
Film thickness distribution (± %): 1.53 to 5.93
Stress (MPa): –154 to –212
Thermal stress stability test (increase)
After a cycle (MPa): 2.4 to 13.7
At 500° C. (MPa): 64.1 to 96.2
Dielectric constant (–): 3.78 to 3.85
Fluorine concentration in a film (peak area ratio) (%): 1.07 to 1.53

From the above-mentioned results, it was found that by replacing an oxidizing gas $N_2O$ with an oxidizing gas $CO_2$, satisfactory film characteristics under broad conditions were able to be obtained. Thermal stability of the film was determined based on the results obtained from a thermal stress stability test, which were: within 20 MPa for stress fluctuation before and after a cycle and within 100 MPa for stress fluctuation before and at 500° C. It can be seen that thermal stability was improved as well.

By setting down the optimum deposition conditions as follows, an analysis was conducted by temperature-programmed desorption (TDS):

(3) One embodiment of optimum deposition conditions (the optimum conditions can be changed by ±30%, preferably ±20% or more preferably ±10%):
Silicon source gas: SiH4 (50 sccm)
Silicon and fluorine source gas: SiF4 (150 sccm)
Oxidizing gas: $CO_2$ (2000 sccm) [$(SiH_4+SiF_4)/CO_2$=0.1]
Inert gas: He (800 sccm)
Total pressure: (300 Pa)
Substrate temperature: (390° C.)
The first RF power source (HRF): 13.56 MHz (2.55 W/cm², 800 W)

The second RF power source (LRF): 430 kHz (1.60 W/cm², 500 W)

(4) Ranges of film characteristics under optimum deposition conditions:
Refractive index (–): 1.45±0.10
Deposition rate (nm): 533±100
Film thickness distribution (±%): 2.0±0.3
Stress (MPa): –150±30
Thermal stress stability test (increase)
After a cycle (MPa): 2.4±1.0
At 500° C. (MPa): 64.0±5.0
Dielectric constant (–): 3.80±0.5
Fluorine concentration in a film (peak area ratio) (%): 1.53±0.3

Figure 2:
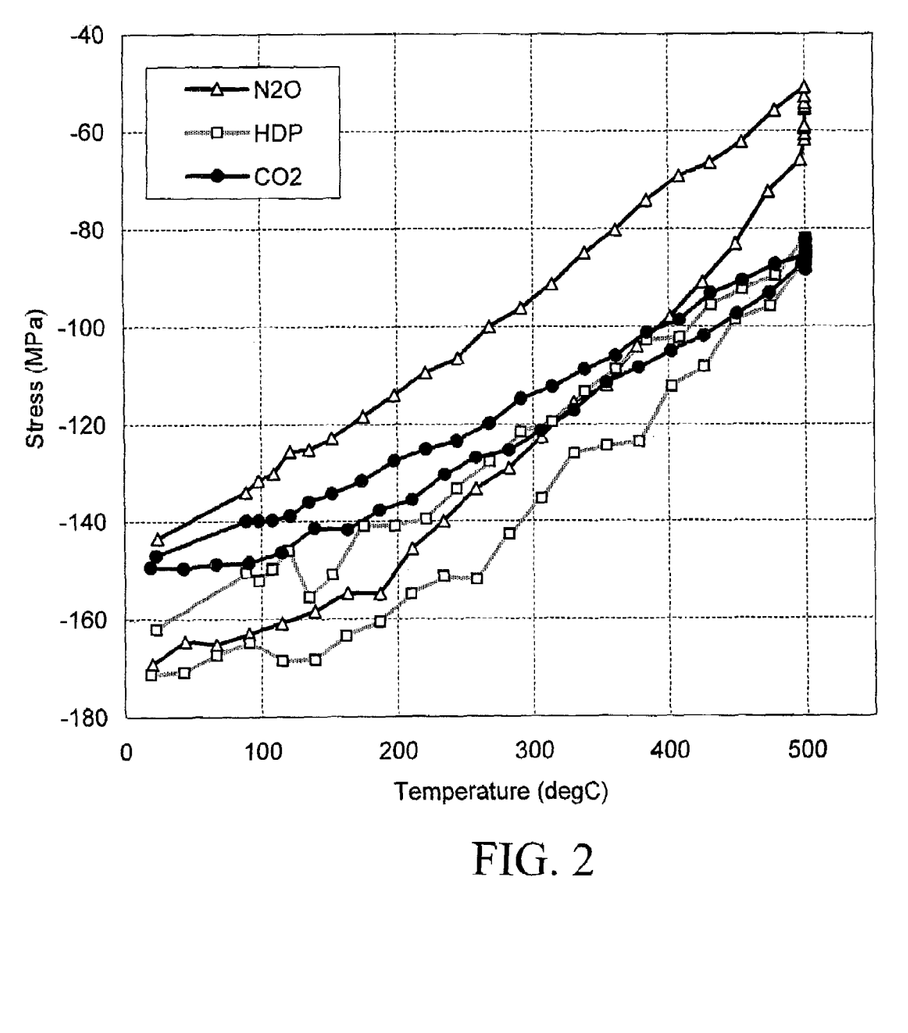
FIG. 2 is a graph showing the relationship between stress [MPa] and temperature [° C.] in embodiments of the present invention ($CO_2$) as compared with $N_2O$ and HDP (high density plasma).
Figure 3:
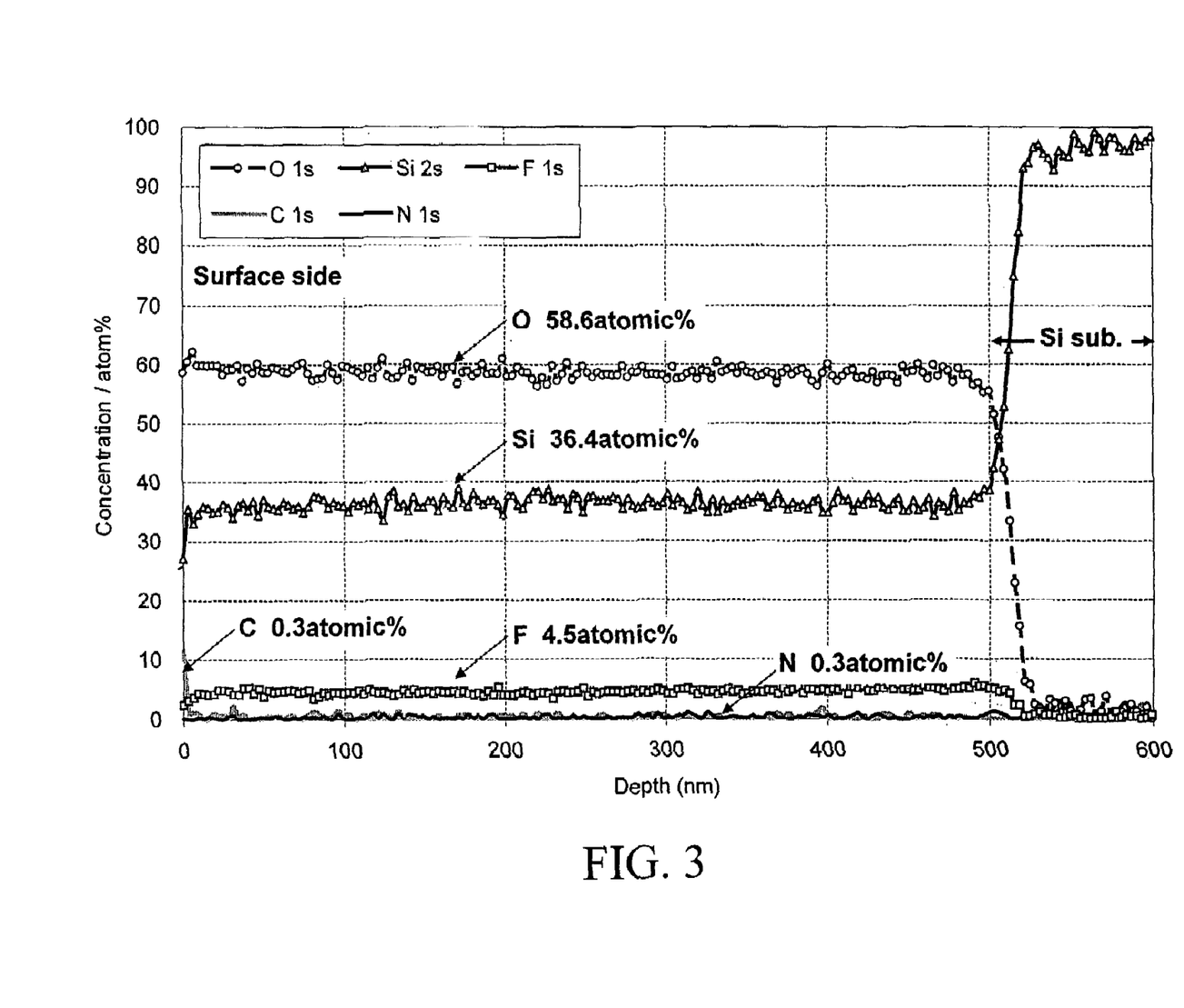
FIG. 3 is a graph showing results of XPS (X-ray photoelectron spectroscopy) of F-doped silicon oxide film using $N_2O$.
Figure 4:
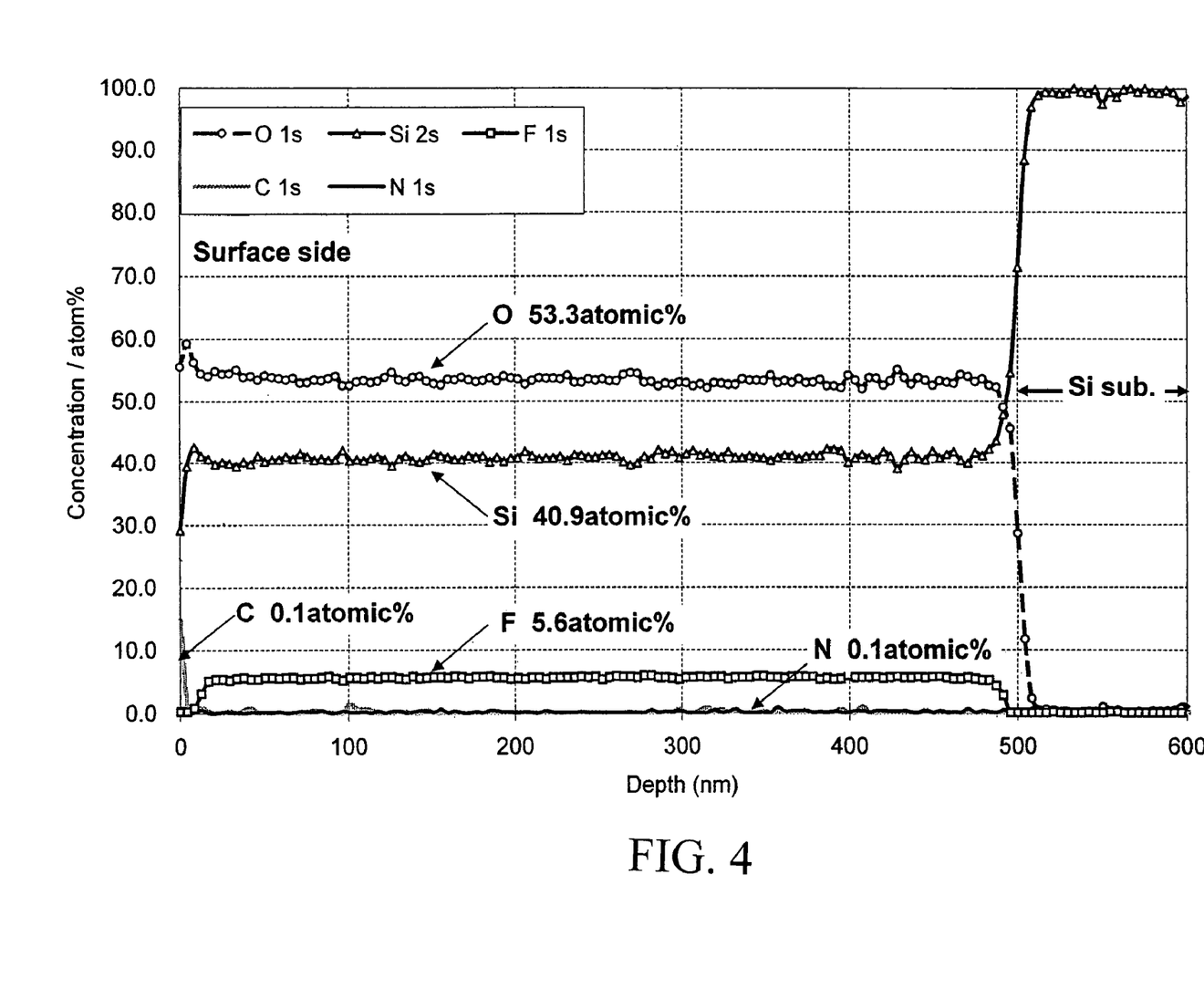
FIG. 4 is a graph showing results of XPS (X-ray photoelectron spectroscopy) of F-doped silicon oxide film using $CO_2$.

The Thermal Stress Stability Test Chart is shown in FIG. 2. From the chart, it can be seen that an improved thermal stability result from the comparative example and the value obtained using a HDP apparatus are equal.

Based on FIG. 2, the thermal stress stability at a different temperature can be estimated. For example, if the highest temperature of the thermal cycle is 450° C., the "After a cycle" value will be 2.4±1.0 MPa, and the "at 450° C." value will be 55.0±5.0 MPa. If in the thermal cycle, the highest temperature is not maintained for one hour but used as a turning point, the "at 500° C." value will be 59.0±5.0 MPa, and the "at 450° C." value will be 50.0±5.0 MPa. The above show that the films obtained according to the above examples of the present invention have excellent thermal stability.

Figure 5:
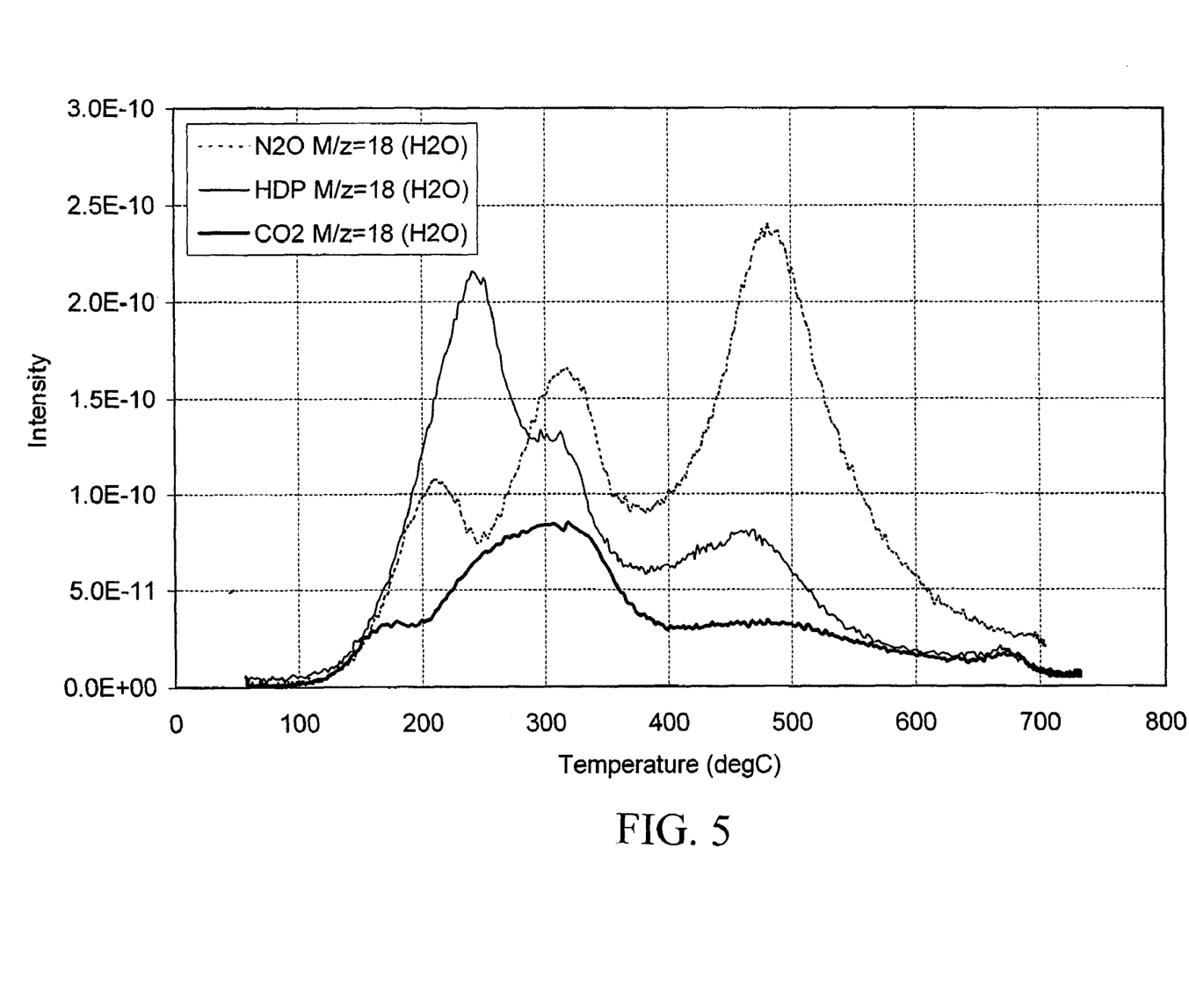
FIG. 5 is a graph showing results of TDS (thermal desorption spectroscopy) with respect to $H_2O$.
Figure 6:
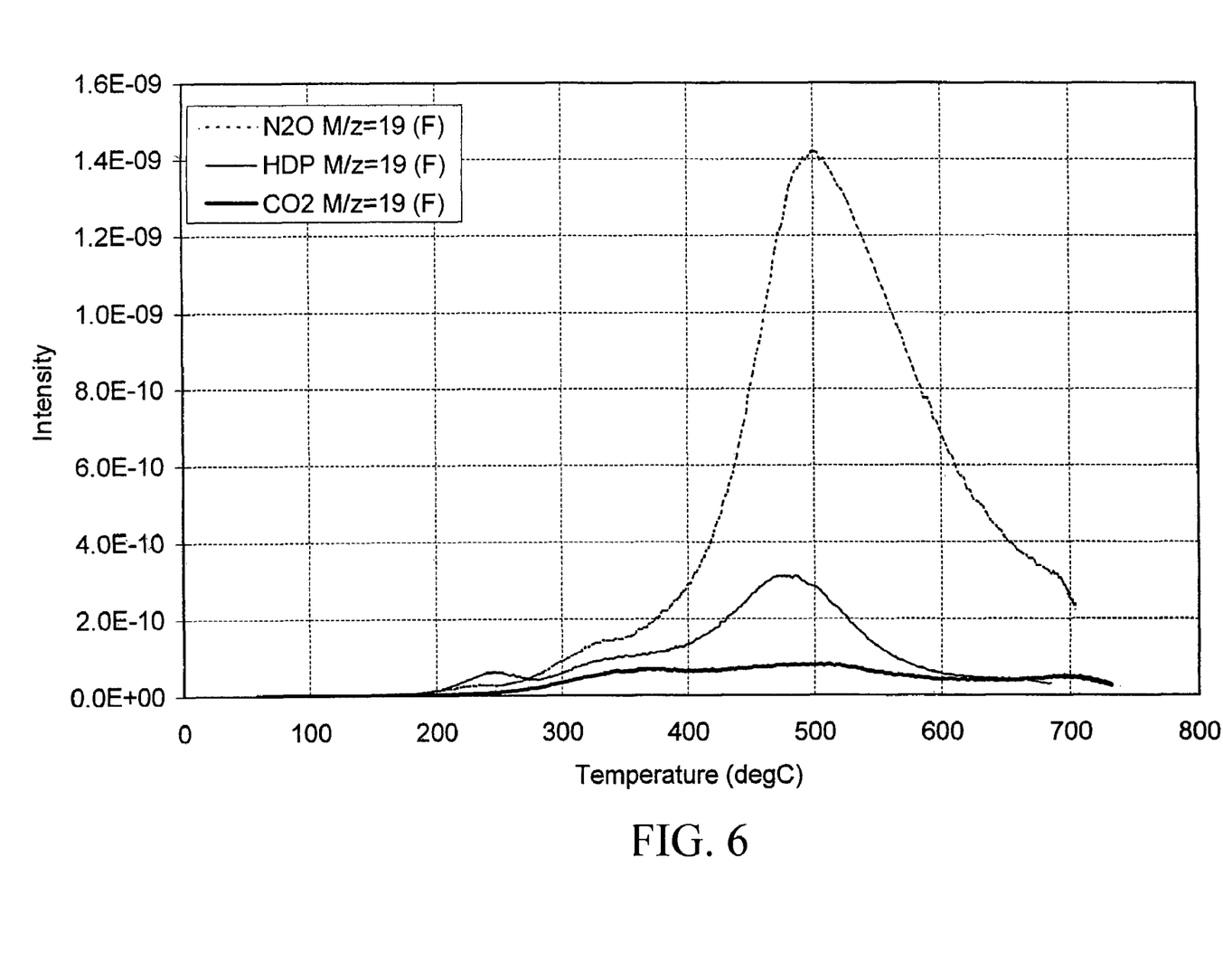
FIG. 6 is a graph showing results of TDS (thermal desorption spectroscopy) with respect to F.
Figure 7:
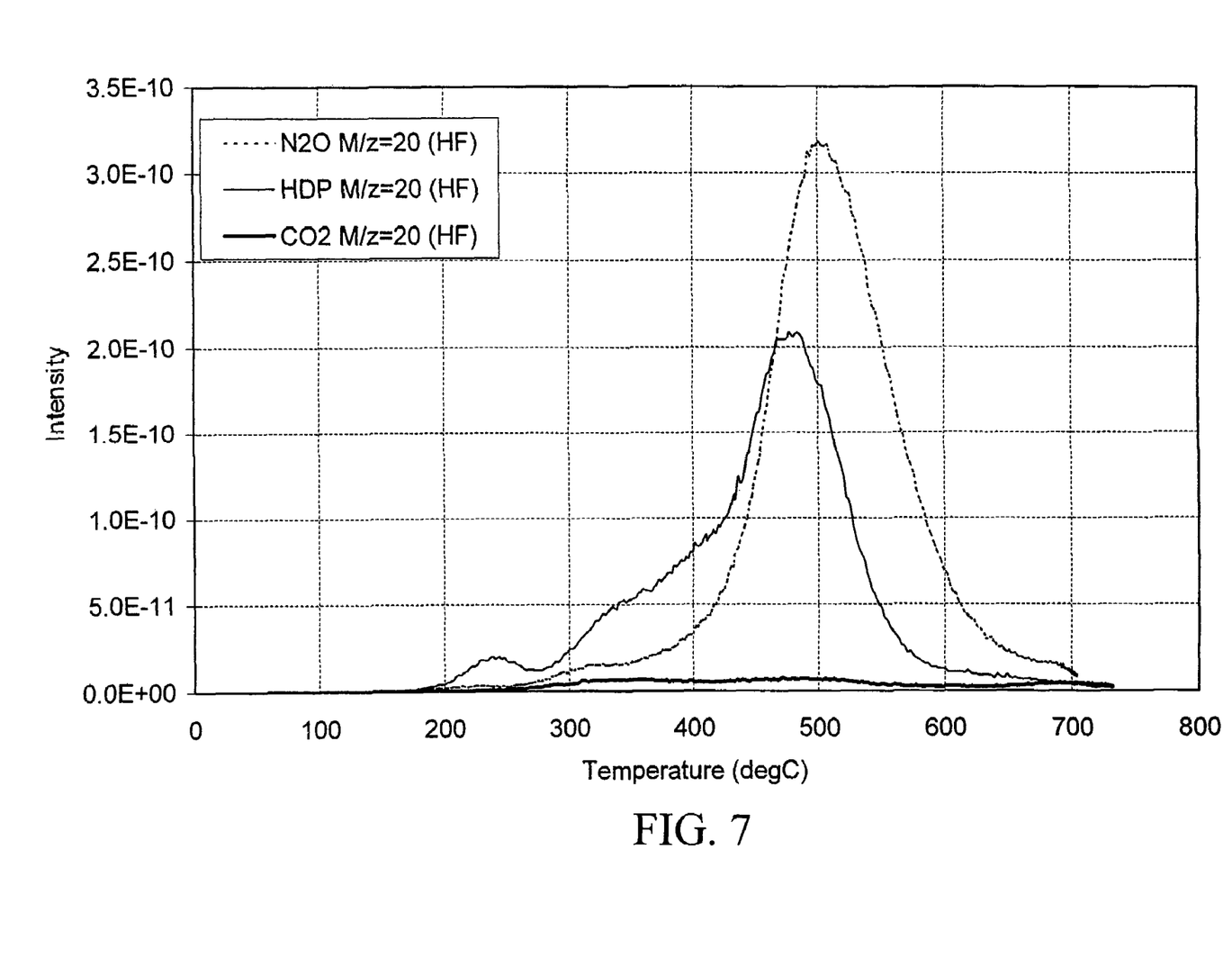
FIG. 7 is a graph showing results of TDS (thermal desorption spectroscopy) with respect to HF.
Figure 8:
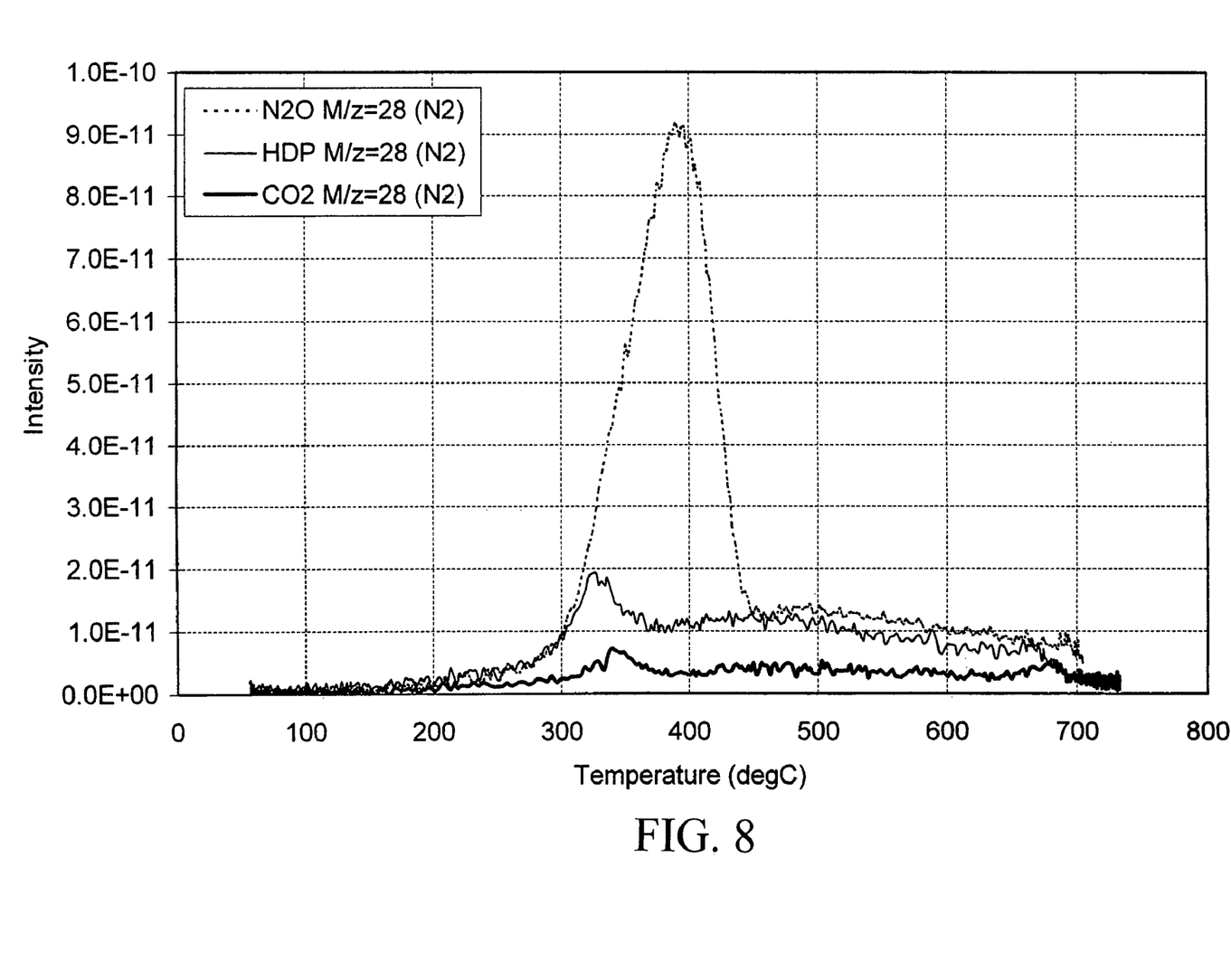
FIG. 8 is a graph showing results of TDS (thermal desorption spectroscopy) with respect to $N_2$.
Figure 9:
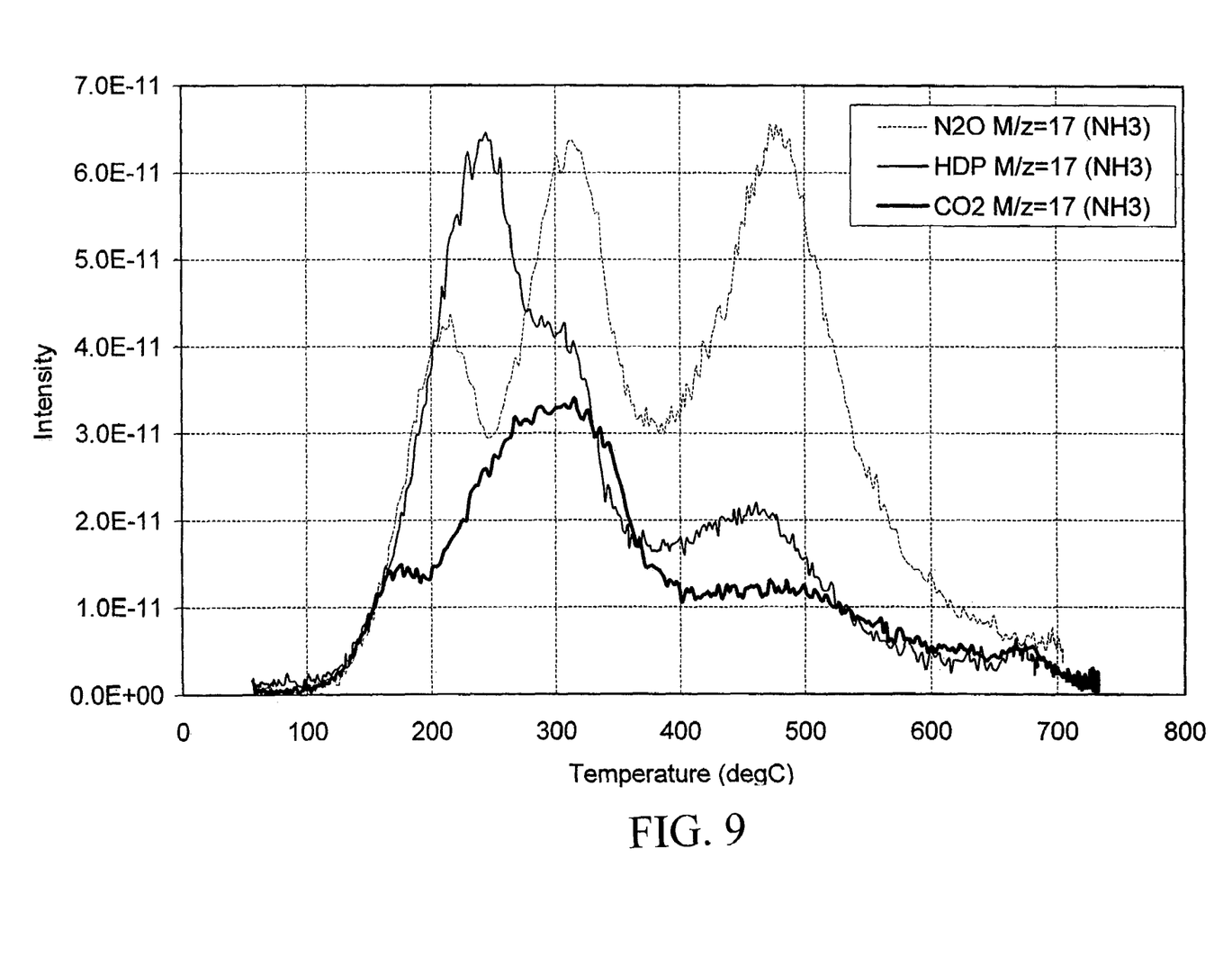
FIG. 9 is a graph showing results of TDS (thermal desorption spectroscopy) with respect to $NH_3$.
Figure 10:
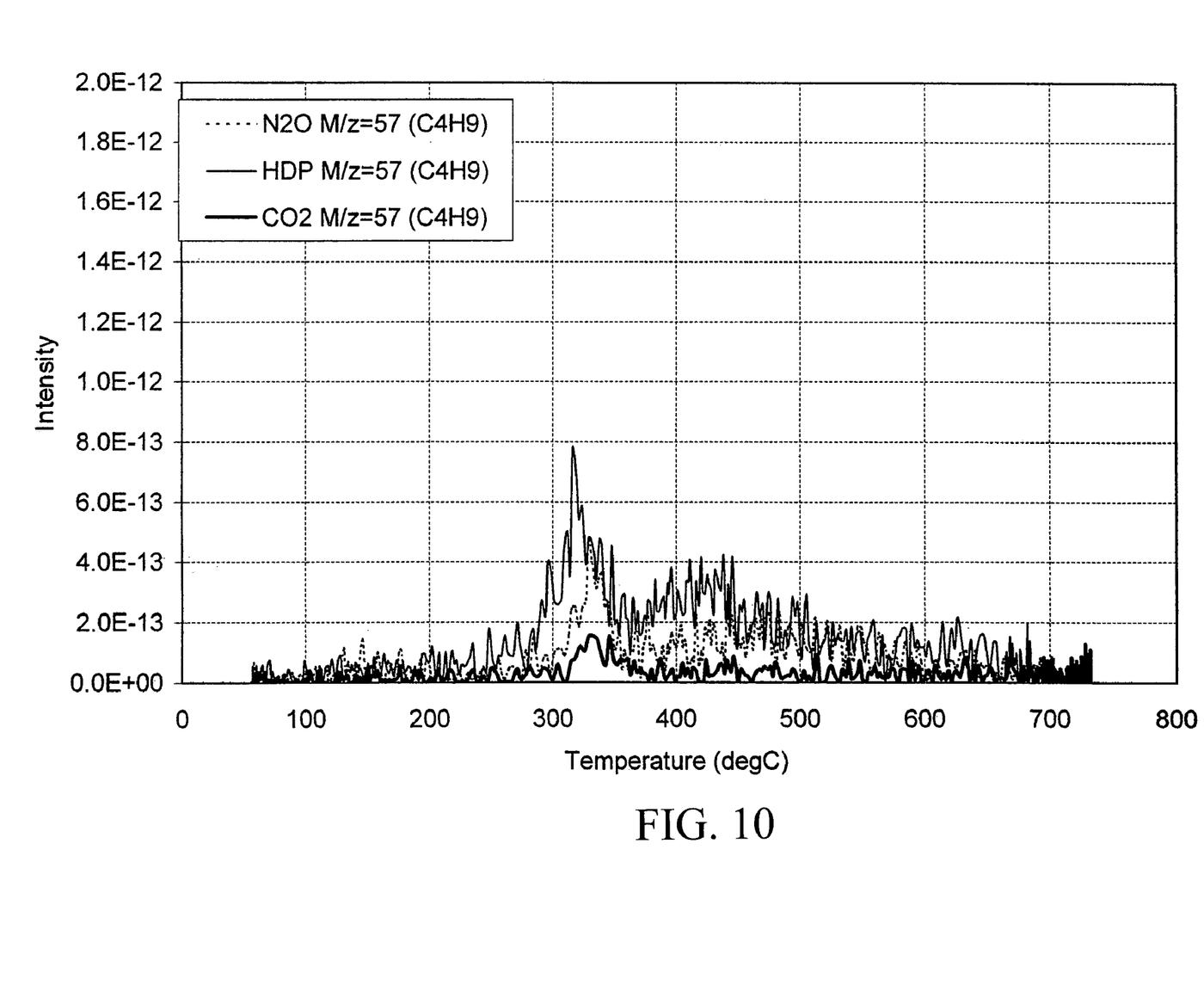
FIG. 10 is a graph showing results of TDS (thermal desorption spectroscopy) with respect to $C_4H_9$.
Figure 11:
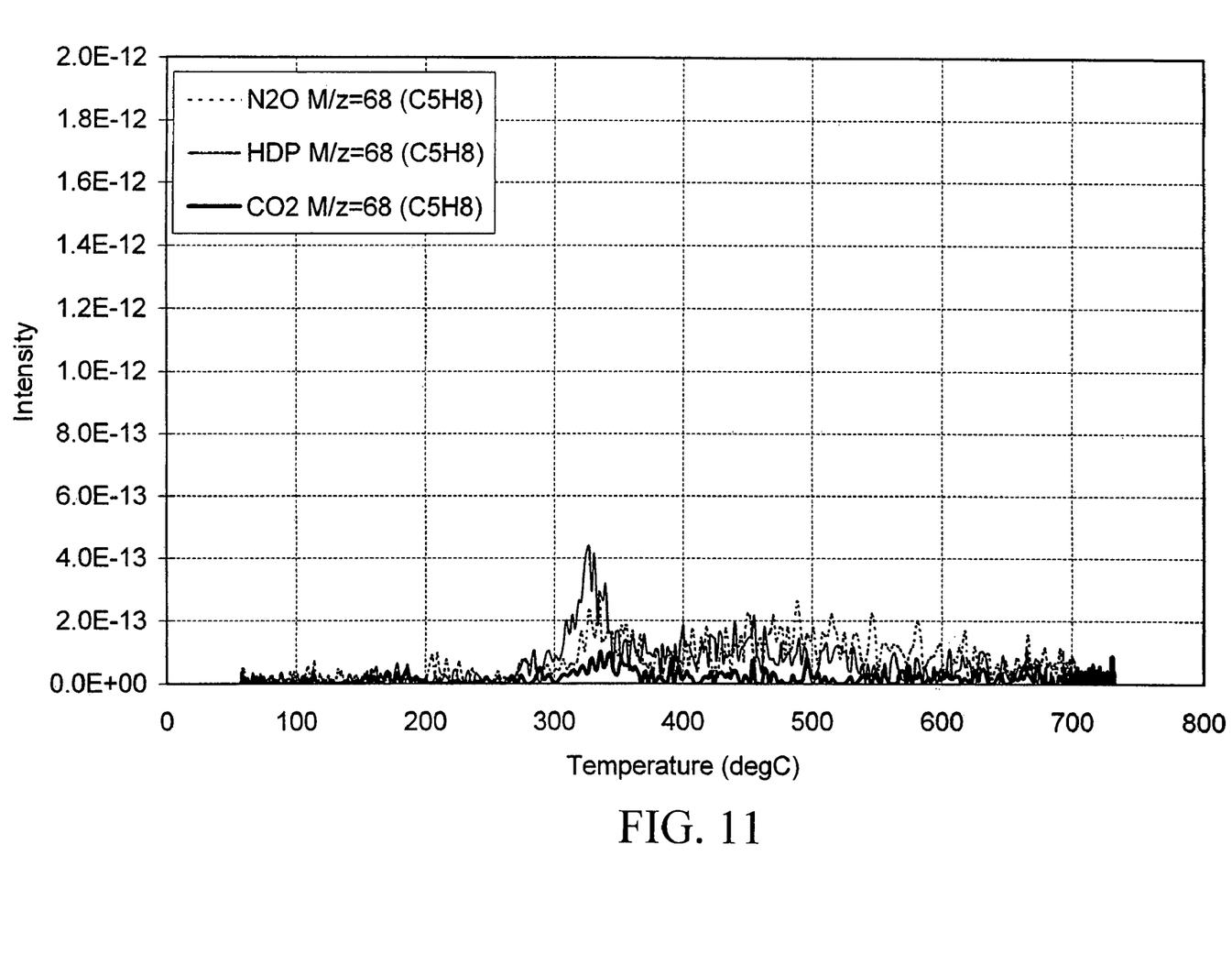
FIG. 11 is a graph showing results of TDS (thermal desorption spectroscopy) with respect to $C_5H_8$.

Additionally, the temperature-programmed desorption (TDS) results are shown in FIG. 5 ($H_2O$), FIG. 6 (F), FIG. 7 (HF), FIG. 8 ($N_2$), FIG. 9 ($NH_3$), FIG. 10 ($C_4H_9$), and FIG. 11 ($C_5H_8$). From these results, it is seen that the present invention has less desorption at 400° C. and above as compared with the comparative example and the example using the HDP apparatus. These results indicate that thermal stability of the film is excellent.

Next, using conditions similar to the above, a fluorine-doped silicon oxide film was formed using $CO_2$ as the oxidizing gas and subjected to an ESCA analysis. In the ESCA, the quantitative precision was approximately ±1 atomic %, and the limit of detection was approximately 1 atomic % (this depended on the element). The results are shown in Table 1.

TABLE 1

| | Atomic % | | | | |
|---|---|---|---|---|---|
| Si | O | F | C | H | N |
| 31.2 | 62.9 | 5.9 | ND | ND | ND |

Further, using conditions similar to the above, another fluorine-doped silicon oxide film was formed using $CO_2$ as the oxidizing gas and subjected to a SIMS analysis. In the SIMS, concentration (atomic %) of elements were calculated as the film was $SiO_2$ having a density of $6.6 \times 10^{22}$ atoms/cm$^3$. The results are shown in Table 2 and also in FIG. 12.

TABLE 2

Averaged values from a depth of 0.02 μm to a depth of 0.4 μm

| Si (Cts/sec)* | O (Cts/sec) | F (atomic %) | C (atomic %) | H (atomic %) | N (atomic %) |
|---|---|---|---|---|---|
| 1071.5 | 2237.0 | 6.53 | 1.22 | 0.76 | 0.07 |

*Secondary ion counts (counts/sec)

Figure 12:
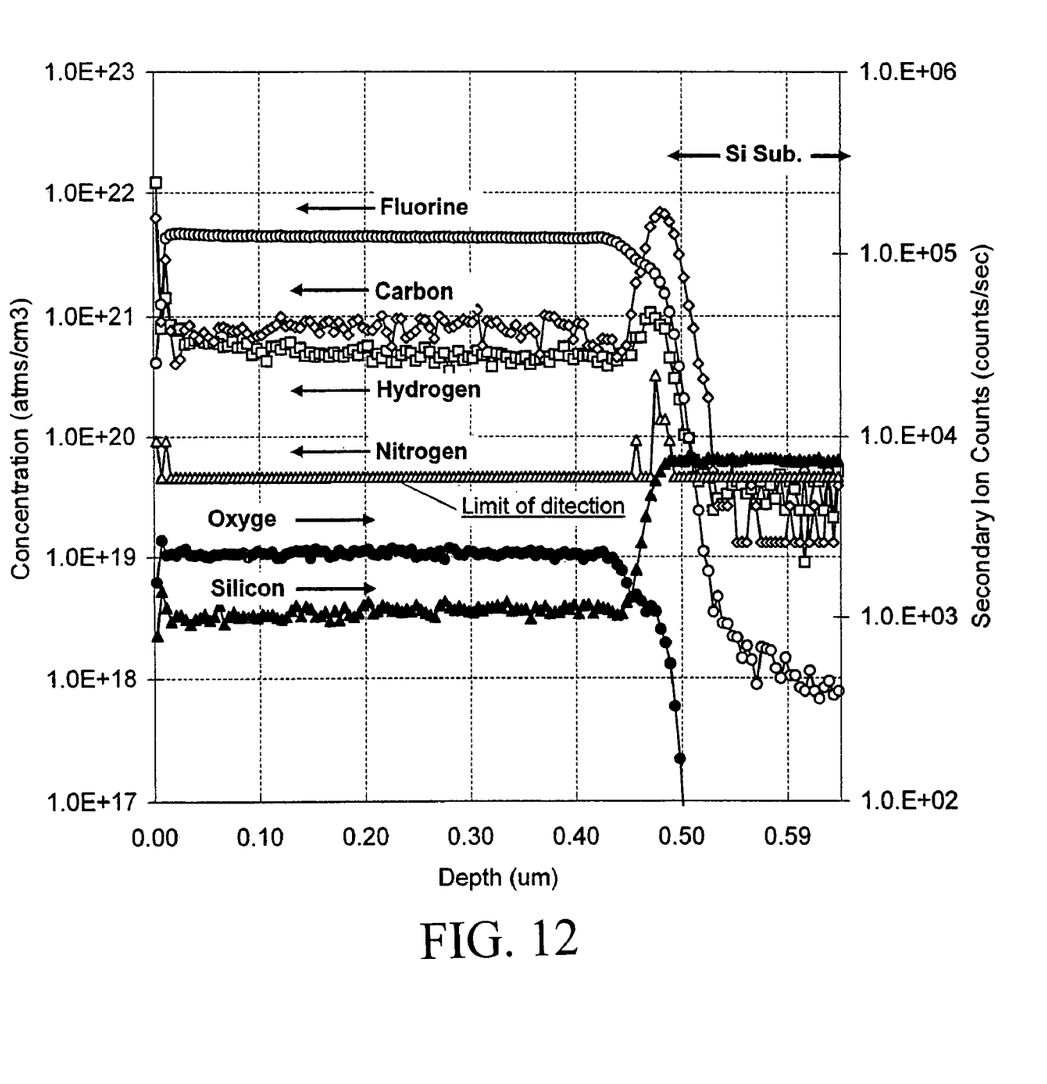
FIG. 12 is a SIMS profile of a fluorine-doped silicon oxide film according to an embodiment of the present invention.

In the film, the intensity of secondary ion counts of O was stronger than that of Si, and in view of the results of Table 1, it can be concluded that the film had a nearly ideal structure wherein the concentration of O was twice that of Si, and nearly or substantially no hydrogen was contained. Thus, the film can be highly stable in thermal and environmental characteristics. The concentration of each element was nearly or substantially constant in a thickness direction as shown in FIG. 12. The concentration of hydrogen did not increase as the film was depositing, i.e., hydrogen did not accumulate during film formation, thereby accomplishing uniformity of properties in a thickness direction.

Effects

As mentioned in the above, according to embodiments of the present invention, using a capacitive-coupled plasma CVD apparatus for forming low dielectric constant insulating films, with SiH$_4$ as a silicon source gas, SiF$_4$ as a silicon and fluorine source gas, and CO$_2$ as an oxidizing gas, fluorine-doped low-dielectric-constant silicon oxide films having a low dielectric constant and high thermal stability can be formed.

Additionally, according to embodiments of the present invention, a method of forming fluorine-doped low-dielectric-constant silicon oxide films can easily be provided.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a fluorine-doped silicon oxide film nearly or substantially free of hydrogen, using capacitive-coupled plasma CVD, comprising:
   introducing a processing gas comprising SiH$_4$ as a silicon source gas, SiF$_4$ as a fluorine source gas, and CO$_2$ as an oxygen source gas to a reaction chamber at a flow ratio of (SiH$_4$+SiF$_4$)/CO$_2$ in the range of about 0.02 to about 0.2 and at a total pressure of about 250 Pa to about 350 Pa; and
   applying first RF power at a frequency of about 10 MHz to about 30 MHz and second RF power at a frequency of about 400 kHz to about 500 kHz with lower intensity than that of the first RF power by overlaying the two RF powers to generate a plasma reaction field within the reaction chamber, thereby depositing on a substrate a fluorine-doped silicon oxide film nearly or substantially free of hydrogen.

2. The method according to claim 1, wherein the processing gas further comprises an inert gas at a flow rate more than ten times that of SiH$_4$.

3. The method according to claim 2, wherein the inert gas is He and/or Ar.

4. The method according to claim 1, wherein a frequency of the first RF power is about 13.56 MHz, its intensity is in the range of about 1.0 W/cm$^2$ to about 5.0 W/cm$^2$, and a frequency of the second RF power is about 430 kHz, and its intensity is in the range of about 0.5 W/cm$^2$ to about 3.0 W/cm$^2$.

5. The method according to claim 1, wherein CO$_2$ is the sole oxygen source gas.

6. The method according to claim 1, wherein the SiH$_4$ gas, the SiF$_4$ gas, and the CO$_2$ gas are introduced into the reaction chamber as a mixture of the gases.

7. A method of forming a fluorine-doped silicon oxide film nearly or substantially free of hydrogen, using capacitive-coupled plasma CVD, comprising:
   introducing a processing gas comprising SiH$_4$ as a silicon source gas, SiF$_4$ as a fluorine source gas, CO$_2$ as an oxygen source gas, and an inert gas to a reaction chamber;
   applying first RF power at a frequency of about 10 MHz to about 30 MHz and second RF power at a frequency of about 400 kHz to about 500 kHz with lower intensity than that of the first RF power by overlaying the two RF powers to generate a plasma reaction field within the reaction chamber; and
   depositing on a substrate a fluorine-doped silicon oxide film nearly or substantially free of hydrogen by controlling a flow of CO$_2$ at a rate which is at least 5 times that of the sum of SiH$_4$ and SiF$_4$ and a flow of the inert gas at a rate which is more than 10 times that of SiH$_4$.

8. A method of forming a fluorine-doped silicon oxide film containing less than 1 atomic % of hydrogen and less than 2 atomic % of carbon, using capacitive-coupled plasma CVD, comprising:
   introducing a processing gas comprising SiH$_4$ as a silicon source gas, SiF$_4$ as a fluorine source gas, and CO$_2$ as an oxygen source gas without including O$_2$ gas to a reaction chamber; and
   generating an O-containing plasma for oxidizing the SiH$_4$ and the SiF$_4$ to deposit a fluorine-doped silicon oxide film on a substrate while generating a CO-containing plasma for controlling the oxidization, using a combination of a frequency of about 10 MHz to about 30 MHz and a frequency of about 400 kHz to about 500 kHz to dissociate hydrogen nearly or substantially without doping carbon into the fluorine-doped silicon oxide film.

9. The method according to claim 8, wherein first RF power at a frequency of about 10 MHz to about 30 MHz has intensity higher than that of second RF power at a frequency of about 400 kHz to about 500 kHz.

10. The method according to claim 9, wherein a frequency of the first RF power is about 13.56 MHz, its intensity is in the range of about 1.0 W/cm$^2$ to about 5.0 W/cm$^2$, and a frequency of the second RF power is about 430 kHz, and its intensity is in the range of about 0.5 W/cm$^2$ to about 3.0 W/cm$^2$.

11. The method according to claim 8, wherein the flow ratio of (SiH$_4$+SiF$_4$)/CO$_2$ is about 0.02 to 0.2.

12. The method according to claim 8, wherein the processing gas further comprises an inert gas at a flow rate more than ten times that of SiH$_4$.

13. The method according to claim 12, wherein the inert gas is He and/or Ar.

14. The method according to claim 8, wherein CO$_2$ is the sole oxygen source gas.

15. The method according to claim 8, wherein the oxidization is conducted at a temperature of about 150° C. to about 450° C.

16. A method of forming a fluorine-doped silicon oxide film containing nearly or substantially no hydrogen and nearly or substantially no carbon doped, using capacitive-coupled plasma CVD, comprising:
    introducing a processing gas comprising $SiH_4$ as a silicon source gas, $SiF_4$ as a fluorine source gas, and $CO_2$ as a single oxygen source gas to a reaction chamber;
    applying first RF power at a frequency of about 10 MHz to about 30 MHz and second RF power at a frequency of about 400 kHz to about 500 kHz by overlaying the two RF powers to generate a plasma reaction field within the reaction chamber, thereby depositing on a substrate a fluorine-doped silicon oxide film containing nearly or substantially no hydrogen and nearly or substantially no carbon doped; and
    improving thermal stability of the depositing fluorine-doped silicon oxide film as a function of a flow of $CO_2$ with respect to that of the sum of $SiH_4$ and $SiF_4$ and as a function of concentration of hydrogen in the film.

17. The method according to claim 16, wherein a flow ratio of $(SiH_4+SiF_4)/CO_2$ is in the range of about 0.02 to about 0.2.

18. The method according to claim 16, wherein the processing gas further comprises an inert gas at a flow rate more than ten times that of $SiH_4$.

19. The method according to claim 18, wherein the inert gas is He and/or Ar.

20. The method according to claim 18, wherein the first RF power has higher intensity than that of the second RF power.

21. A fluorine-doped silicon oxide film obtained by the method of any of claims 1, 7, 8, or 16, containing 30–45 atomic % of silicon, 50–70 atomic % of oxygen, 4–8 atomic % of fluorine, less than 1 atomic % of hydrogen, less than 1.5 atomic % of carbon, and less than 1 atomic % of of nitrogen.

22. The fluorine-doped silicon oxide film according to claim 21, wherein the concentration of each element is nearly or substantially constant in a thickness direction.

23. The fluorine-doped silicon oxide film according to claim 21, which has a dielectric constant of 3.5 to 4.0.

24. The fluorine-doped silicon oxide film according to claim 21, which is an insulating film in an interconnect structure.

* * * * *